(12) United States Patent
Tam et al.

(10) Patent No.: US 6,734,737 B2
(45) Date of Patent: May 11, 2004

(54) OUTPUT DISTORTION CORRECTION AMPLIFIER SYSTEM

(75) Inventors: Kimo Y. F. Tam, Lincoln, MA (US); Stefano D'Aquino, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/167,887

(22) Filed: Jun. 12, 2002

(65) Prior Publication Data

US 2003/0231060 A1 Dec. 18, 2003

(51) Int. Cl.[7] .................................................. H03F 3/45
(52) U.S. Cl. ........................ 330/257; 330/255; 330/260
(58) Field of Search ................................ 330/257, 255, 330/259, 260, 262, 292

(56) References Cited

U.S. PATENT DOCUMENTS 4,888,559 A * 12/1989 Sevenhans et al. ......... 330/253
5,808,511 A * 9/1998 Kobayashi .................. 330/149
6,448,853 B1 * 9/2002 Harvey ....................... 330/252
6,586,997 B1 * 7/2003 D'Aquino et al. .......... 330/257

* cited by examiner

Primary Examiner—Patricia Nguyen
(74) Attorney, Agent, or Firm—Iandiorio & Teska

(57) ABSTRACT

An output distortion correction amplifier system includes an input stage; a current mirror connected to the input stage; an output stage having its input connected to the input stage and a current mirror and its output connected to the input stage; a compensation impedance connected to the input of the output stage; and a distortion correction circuit for directly sensing the distortion voltage across the output stage and providing to the current mirror a current representative of the distortion voltage for delivering to the compensation impedance a correction current to develop a correction voltage at the input of the output stage to nullify the effect of the distortion voltage.

15 Claims, 6 Drawing Sheets

OUTPUT DISTORTION CORRECTION AMPLIFIER SYSTEM

FIELD OF THE INVENTION

This invention relates to an output distortion correction amplifier system.

BACKGROUND OF THE INVENTION

Voltage feedback amplifier systems typically employ a differential transconductance input stage including a current mirror to drive an output stage which drives a load. The output of the output stage is fed back to the inverting input of the input stage. A compensation capacitor is connected to the high impedance node at the input to the output stage. These amplifier systems work well, drawing little current at their inverting and non-inverting inputs yet supplying at the output stage significant current to drive a load. One problem with these amplifier options is that the output stage is non-linear and introduces distortion due to transistor $\Delta V_{be}$. To combat this problem, in one approach, an internal distortion correction network is introduced between the output of the output stage and the current mirror and input stage, U.S. Pat. No. 5,166,637. This approach adds a buffer stage between the high impedance node and the current mirror, a capacitor between the current mirror and the output of the output stage and also adds a current source in series with the current mirror. This added current source supplies a fixed amount of current. Thus, in systems where the signal can vary widely requiring a wide range of current, this current source can limit the operation and application of the system and limit the voltage headroom. Another issue with that approach is that the error voltage is sensed not directly across the output stage but indirectly using another buffer amplifier and current source.

BRIEF SUMMARY OF THE INVENTION

It is therefore an object of this invention to provide an improved output distortion correction amplifier system.

It is a further object of this invention to provide such an improved output distortion correction amplifier system compatible with voltage feedback amplifiers, or any others that have an output buffer that may introduce $\Delta v_{be}$ distortion.

It is a further object of this invention to provide such an improved output distortion correction amplifier system which is simple and effective, and does not require adding a current source in series with the current mirror where it would limit the current range and voltage headroom.

It is a further object of this invention to provide such an improved output distortion correction amplifier system which corrects for the distortion locally at the output stage where it occurs and does not interfere with the input stage.

It is a further object of this invention to provide such an improved output distortion correction amplifier system which directly senses the distortion voltage across the output stage.

This invention results from the realization that a simple, more effective distortion correction amplifier system for any amplifier that may experience $\Delta V_{be}$ distortion in the output stage can be achieved without added current sources in series with the current mirror and without limiting voltage headroom by sensing the distortion voltage locally, directly across the output stage, generating a current representative of that distortion voltage and providing it to a current mirror associated with the input stage for delivering to the compensation impedance a correction current to develop a correction voltage at the input of the output stage to locally nullify the effect of the distortion voltage without interfering with the input stage.

This invention features an output distortion correction amplifier system including an input stage, a current mirror connected to the input stage, and an output stage having its input connected to the input stage and current mirror and its output connected to the input stage. A compensation impedance is connected to the input of the output stage. A distortion correction circuit directly senses a distortion voltage across the output stage and provides to the current mirror a current representative of the distortion voltage for delivering to the compensation impedance a correction current to develop a correction voltage at the input of the output stage to nullify the effect of the distortion voltage.

In a preferred embodiment, the compensation impedance may include a capacitor. The distortion correction circuit may include at least one buffer amplifier and a nullifying impedance. The nullifying impedance may include a capacitor. The nullifying impedance may be proportional to the compensation impedance and the ratio of the current representative of the distortion voltage to the correction current. The distortion correction circuit may include two-buffer amplifiers with their low impedance outputs connected to the nullifying impedance. The two buffer amplifiers may have their inputs connected across the output stage, and their high impedance outputs connected to the current mirror.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
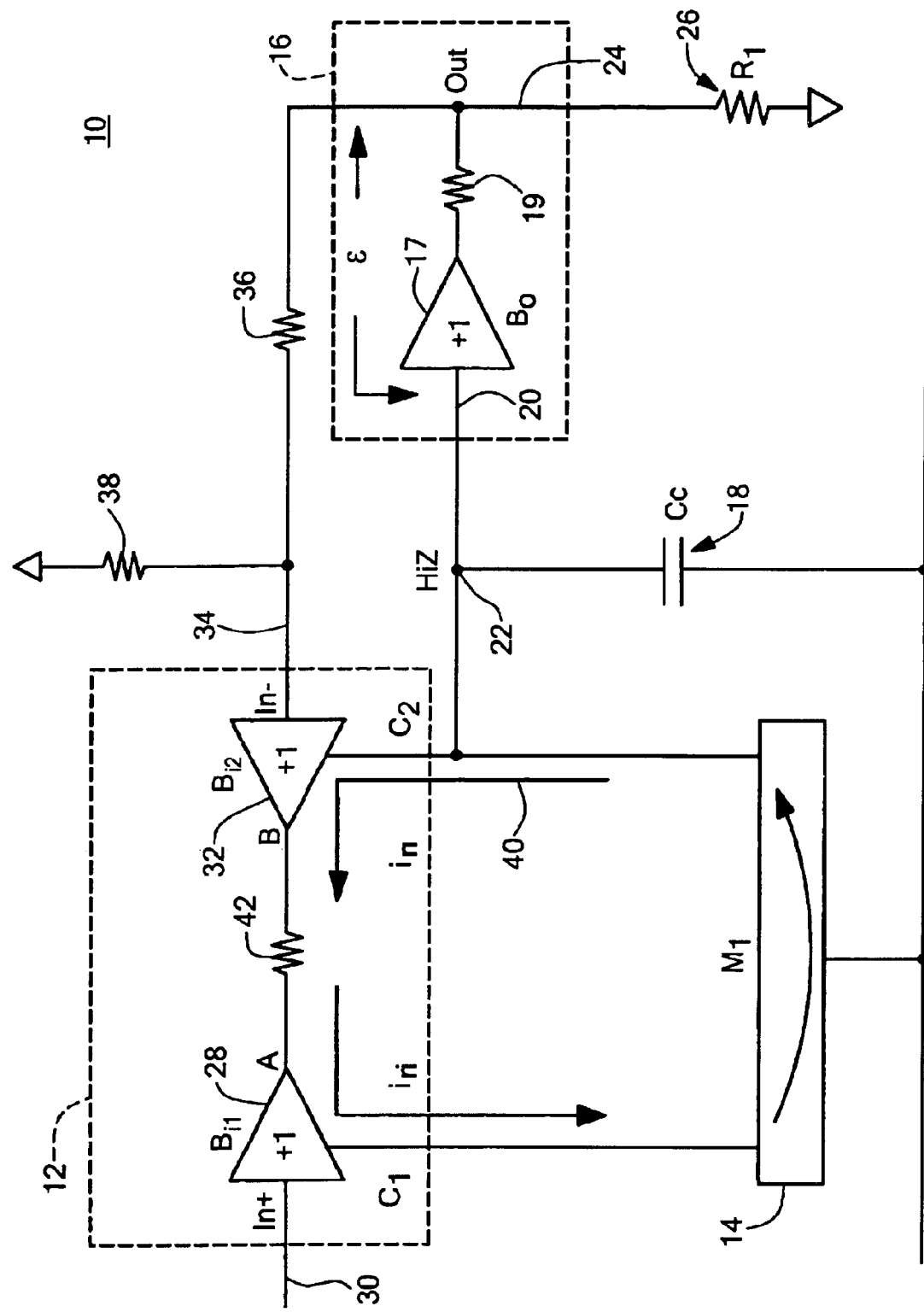
FIG. 1 is a simplified schematic block diagram of a prior art voltage feedback amplifier.

There is shown in FIG. 1 a prior art voltage feedback amplifier 10 including an input stage 12, current mirror 14, output stage 16, and compensation impedance 18 connected to the input 20 of output stage 16 through high impedance node 22. Output stage 16 includes buffer amplifier 17 and resistance 19 representing the internal output resistance of amplifier 17. High impedance node 22 is also connected to input stage 12 and current mirror 14. The output 24 of output stage 16 drives load impedance 26. Input stage 12, in this embodiment, is shown as including buffer amplifier 28 with non-inverting input at its input 30 and buffer amplifier 32 with inverting input at its input 34. The output 24 of output stage 16 is fed through feedback resistor 36 to the inverting input of buffer amplifier 32 which is also connected to gain resistor 38.

In operation, ideally, an input signal at input 30 may differ somewhat from the signal at input 34 causing a current 40 to flow through resistance 42. This current is delivered through high impedance node 22 to compensation impedance 18 which may be e.g., a capacitance $C_c$. The current supplied to compensation impedance 18 develops the voltage at node 22 which is provided to the input 20 of output stage 16. This changes the voltage at output 24 accordingly and this in turn is fed back to the input of buffer amplifier 32.

Practically speaking the components are not ideal and so output stage 16 will develop a distortion voltage often due to the $\Delta V_{be}$ errors and this will cause distortions in the output signal.

Figure 2:
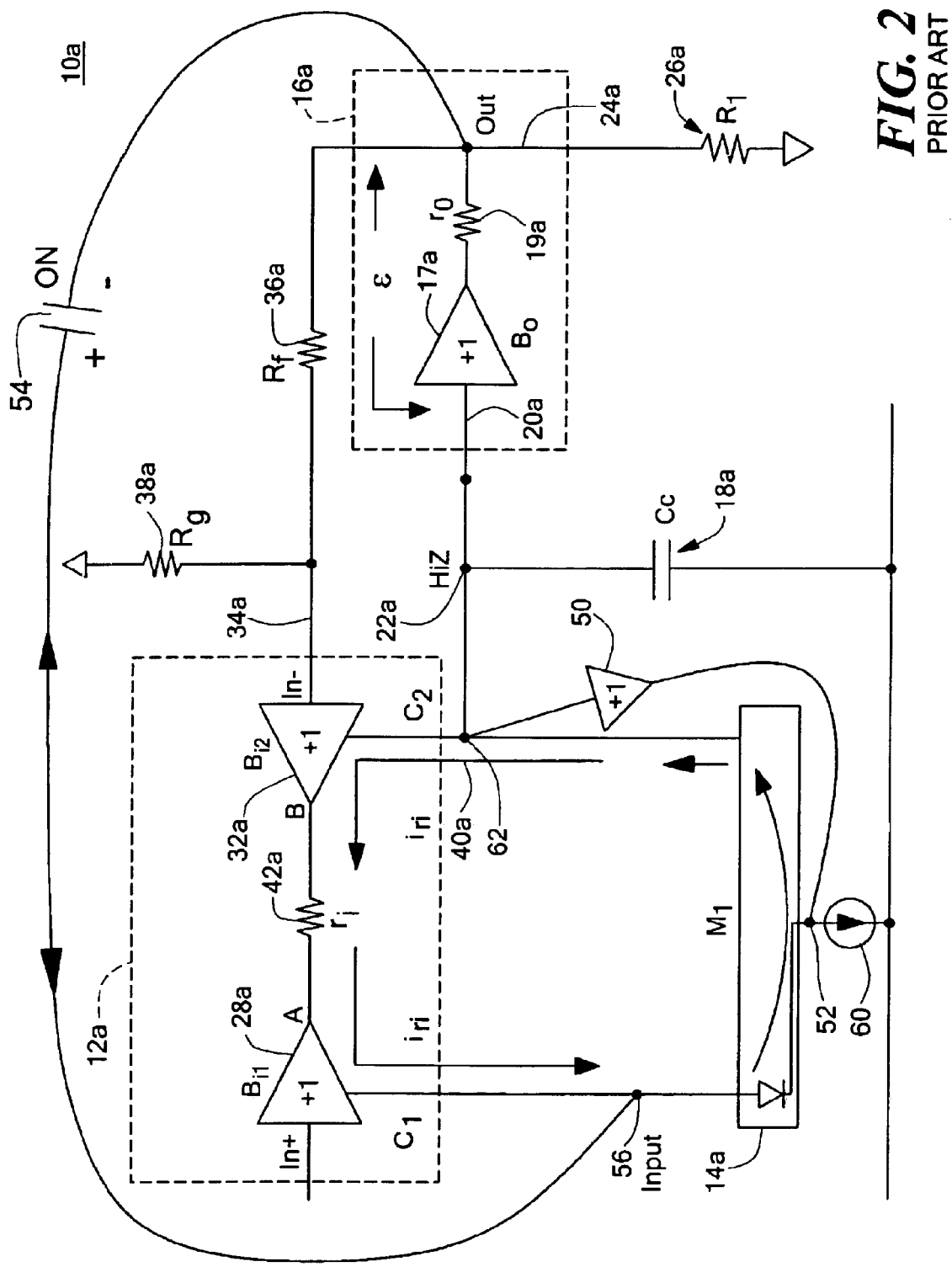
FIG. 2 is a view similar to the view of FIG. 1 of another prior art voltage feedback amplifier showing one approach at correcting $\Delta V_{be}$ voltage distortion in the output stage.

To combat this, in one prior art approach, as explained more fully in U.S. Pat. No. 5,166,637 incorporated in its entirety herein by this reference, an additional buffer amplifier 50, FIG. 2, senses the voltage at high impedance node 22a and delivers it to the ground or common input 52 of current mirror 14a. A nullifying capacitor 54 is connected from the output 24a of output stage 16a to the input side of current mirror 14a at 56.

In operation, any distortion voltage due to $\Delta V_{be}$, for example across output stage 16a referred to as $\epsilon$, causes a change in the voltage at high impedance node 22a. This voltage is delivered by buffer amplifier 50 to the common input 52 of current amplifier 14a. A current source 60 is provided in accordance with this approach connected in series with the current mirror. The presence of this current source places constraints on the current that can flow in current mirror 14a and thus limits the operation of the system and also limits the voltage headroom. The voltage at high impedance node 22a is sensed by buffer amplifier 50 and delivered to terminal 52 between current source 60 and current mirror 14a. Thus, node 52 tracks high impedance node 22a. Node 56 at the input of current mirror 14a in turn tracks node 52. Therefore, the voltage across capacitance 54 is effectively, indirectly, the distortion voltage or error voltage $\epsilon$ which is present on output stage 16a. As a result a current flows from capacitor 54 through node 56 and current mirror 14a and the output 62 of current mirror 14a to compensation impedance 18 e.g., capacitance $C_c$. This current being derived, although indirectly from the distortion voltage $\epsilon$ at output stage 16a, is just sufficient to provide a voltage change on compensation impedance 18 sufficient to compensate for the distortion voltage $\epsilon$. There are a number of shortcomings associated with this solution. One is the constraint on current flow in current mirror 14a, another is the limitation on the voltage headroom and a third is the fact that the distortion voltage at output stage 16a is measured not directly but indirectly through the path from high impedance node 22a, current mirror 14a, output terminal 62, buffer amplifier 50, current mirror 14a, current mirror input node 56, and capacitor 54.

Figure 3:
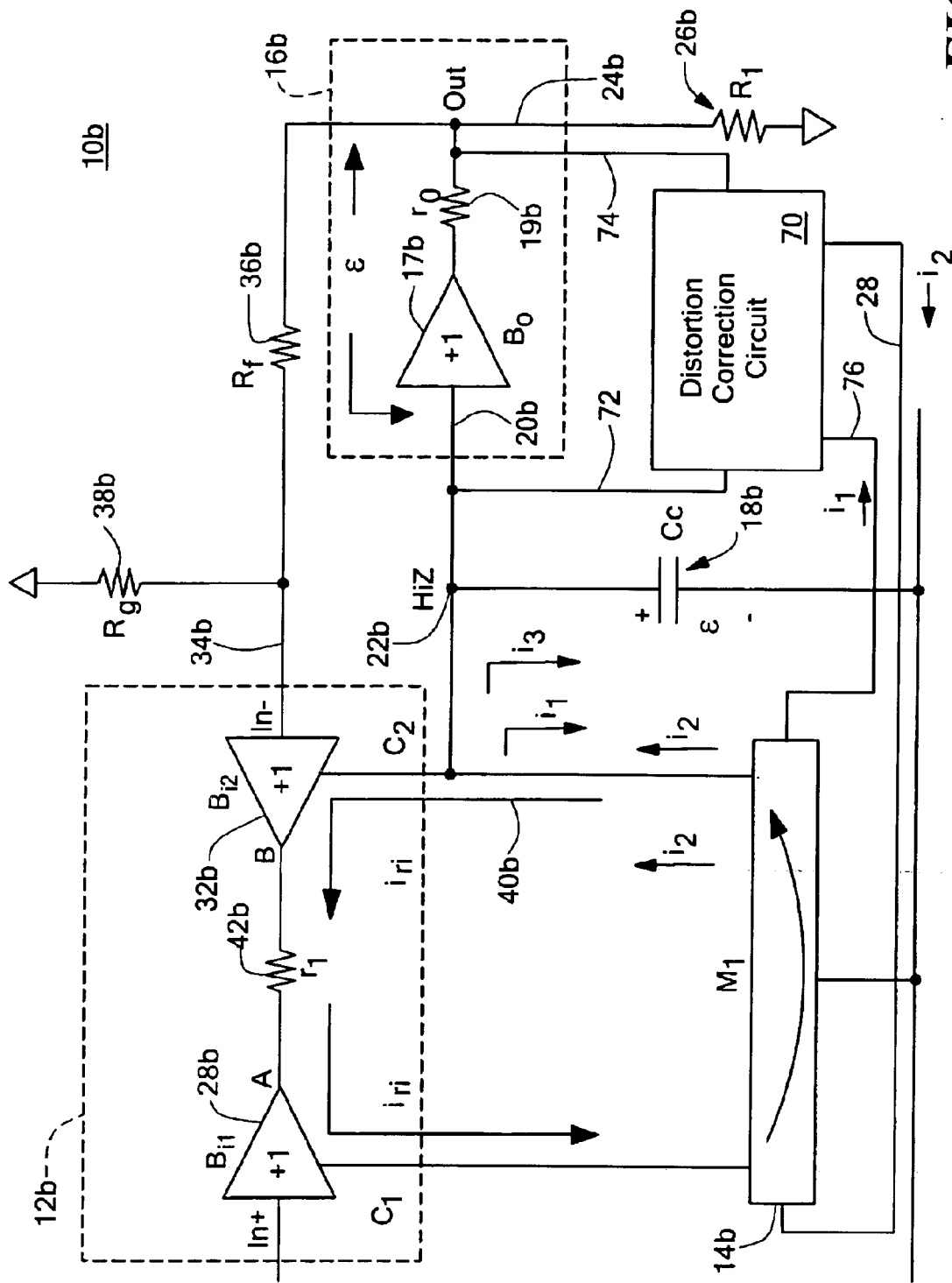
FIG. 3 is a view similar to FIG. 2 showing the output distortion correction amplifier system according to this invention.

In accordance with this invention, an output distortion correction amplifier system 10b includes a distortion correction circuit 70, FIG. 3, that senses the distortion voltage across output stage 16b directly on input lines 72 and 74 and provides a current representative of that voltage on lines 76 and 78 to current mirror 14b. Those currents, $i_1$ and $i_2$ are delivered by current mirror 14b through high impedance node 22b to the compensation impedance 18b, capacitor $C_c$. Those currents are just sufficient to generate a voltage which will nullify or compensate for the distortion voltage $\epsilon$ occurring due to the $\Delta V_{be}$ non-linearities in output stage 16b.

Figure 4:
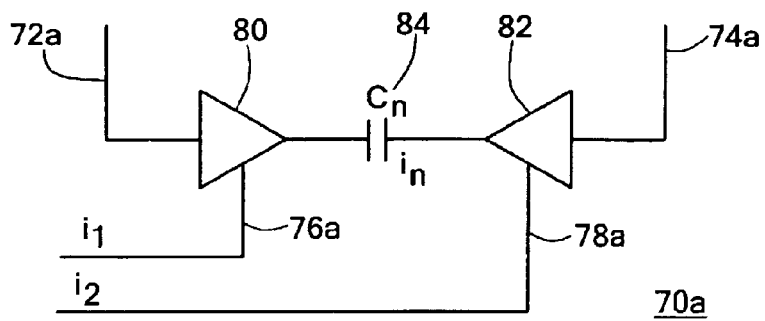
FIGS. 4–6 are simplified schematic block diagrams of a portion of alternative embodiments of the distortion correction circuit of FIG. 3 according to this invention.

Distortion correction circuit 70a, FIG. 4 may include a pair of buffer amplifiers 80 and 82 with their outputs connected together to nullifying capacitor 84. The high impedance outputs of buffer amplifiers 80 and 82 are connected to output lines 76a and 78a. The nullifying impedance, capacitance 84 in FIG. 4 is proportional to the ratio of the total current $i_d = i_1 + i_2$ supplied by the distortion correction circuit 70a, which is equal to the amount of current required to set capacitor 18b to the required voltage to nullify the distortion voltage at output stage 16b, and the current $i_n$ in FIG. 4. Simply stated, $$C_n = \frac{i_n}{i_d} * C_c \tag{1}$$

Figure 5:
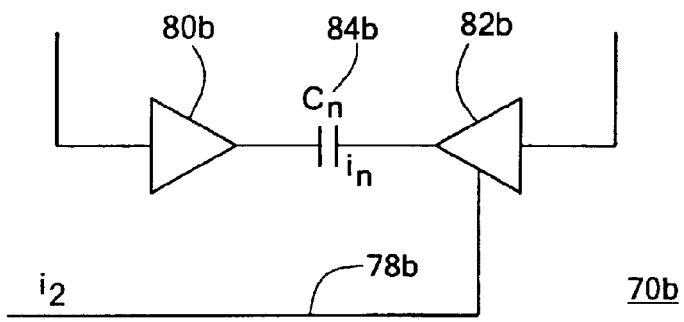
Figure 6:
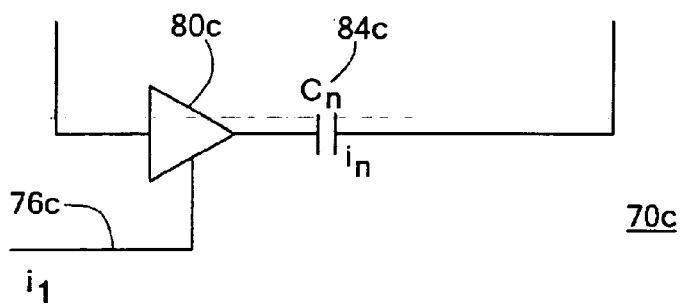
Figure 7:
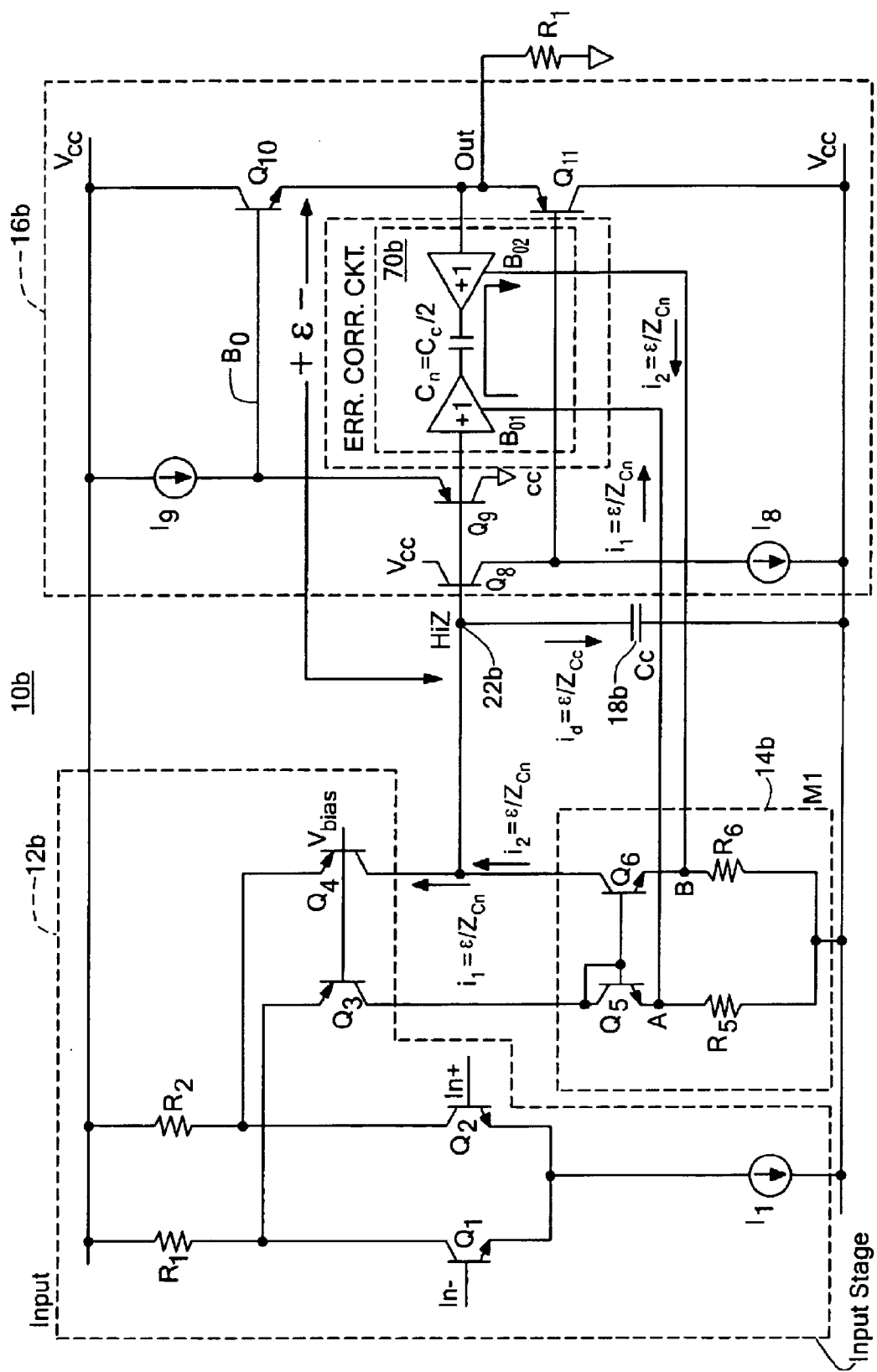
FIG. 7 is a simplified schematic block diagram showing in greater detail the system of FIG. 3.

Although distortion correction circuit 70a is shown as including two outputs in FIG. 4, this is not a necessary limitation. As shown in FIG. 5, only one output, 78b from amplifier 82b is presented by distortion correction circuit 70b in FIG. 5. In this case, in accordance with equation (1) above, the capacitance $C_n$ of 84b would be equal to the capacitance $C_c$ of 18b, whereas in FIG. 4, $C_n$ would be equal to one half of $C_c$. Further, the invention does not require two buffer amplifiers. As shown in FIG. 6, distortion correction circuit 70c may include but one amplifier 80c whose output 76c is the only output to the current mirror. A more detailed implementation of the system of FIG. 3 is shown in FIG. 7 using the distortion correction circuit 70a of FIG. 4.

Figure 8:
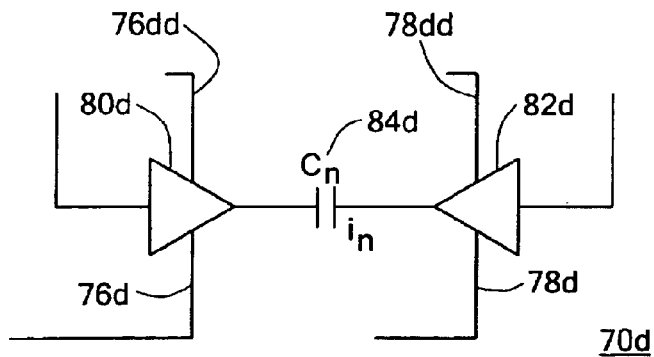
FIG. 8 is a simplified schematic block diagram of another implementation of a distortion correction circuit according to this invention.
Figure 9:
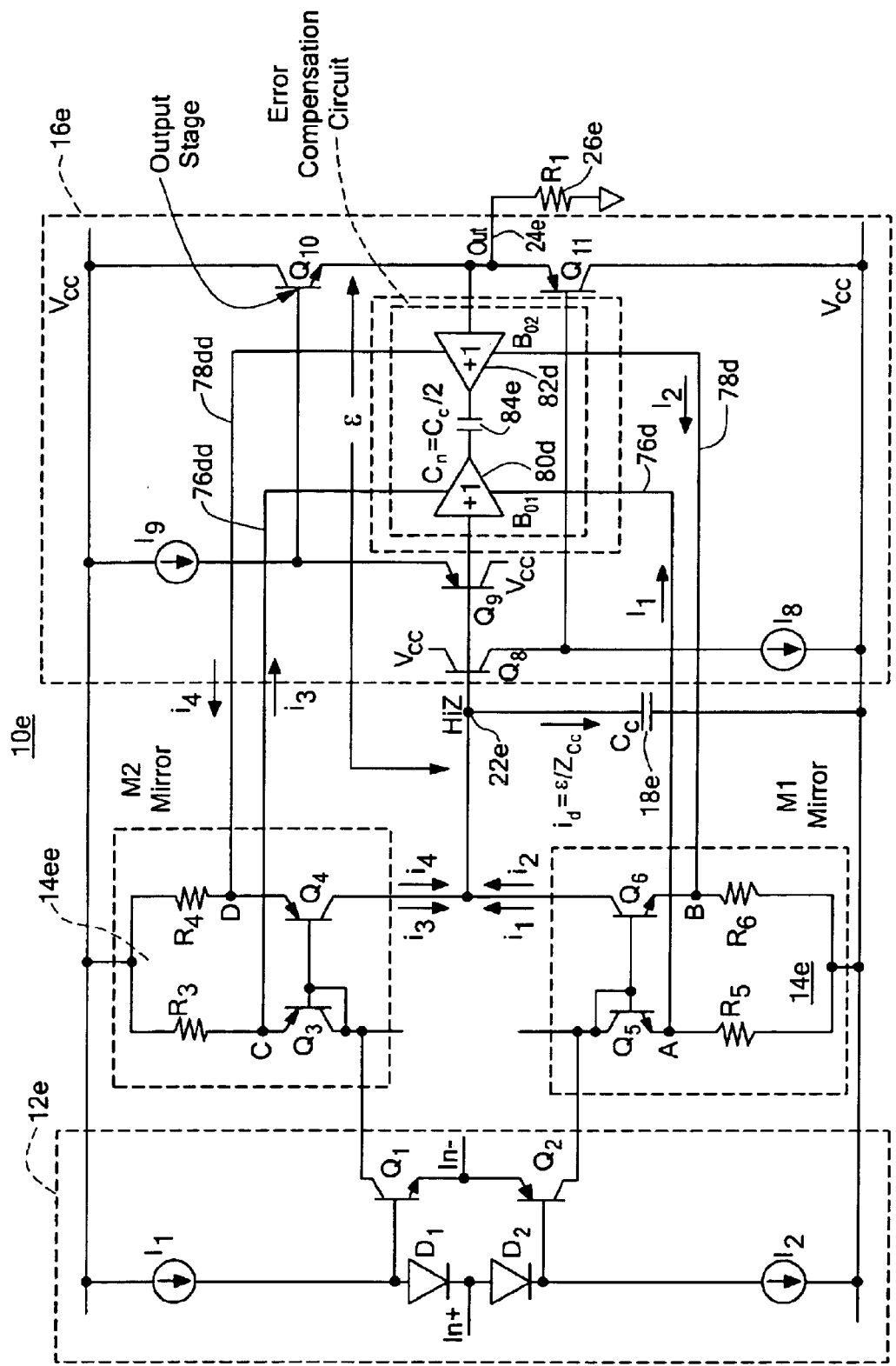
FIG. 9 is a simplified schematic block diagram of the output distortion correction amplifier system of FIG. 3 shown in greater detail with a balanced current mirror construction and using the distortion correction circuit of FIG. 8.

In another embodiment distortion correction circuit 70d, FIG. 8 may include buffer amplifiers 80d and 84d which have dual outputs 76d, 78d, 76dd, and 78dd. This can be employed in a complementary implementation 10e, FIG. 9 in which the current mirror includes two current mirror circuits 14e and 14ee. Current mirror 14e receives the outputs 76d and 78d from buffer amplifiers 80d and 82d and current mirror 14ee receives the outputs 76dd and 78dd from buffer amplifiers 80d and 82d.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. An output distortion correction amplifier system comprising:
   an input stage;
   a current mirror connected to said input stage;
   an output stage having its input coupled to said input stage and current mirror and its output connected to said input stage;
   a compensation impedance connected to the input of said output stage; and
   a distortion correction circuit for directly sensing the distortion voltage across said output stage and providing to said current mirror a current representative of said distortion voltage for delivering to said compensation impedance a correction current to develop a correction voltage at the input of said output stage to nullify the effect of said distortion voltage, in which said distortion correction circuit includes at least one buffer amplifier and a nullifying impedance.

2. The output distortion correction amplifier system of claim 1 in which said nullifying impedance includes a capacitor.

3. The output distortion correction amplifier system of claim 1 in which said nullifying impedance is proportional to the compensation impedance in the ratio of the current representative of the distortion voltage to the correction current.

4. The output distortion correction amplifier system of claim 1 in which said distortion circuit includes two buffer amplifiers with their low impedance outputs connected to said nullifying impedance.

5. The output distortion correction amplifier system of claim 4 in which said two buffer amplifiers have their inputs connected across said output stage.

6. The output distortion correction amplifier system of claim 5 in which said two buffer amplifiers have their high impedance outputs connected to said current mirror.

7. An output distortion correction amplifier system comprising:

an input stage having first and second outputs;

a first current mirror having an input connected to said first output of said input stage and an output;

a second current mirror having an input connected to said second output of said input stage, and an output connected to the output of the first current mirror;

an output stage having an input connected to the outputs of said first and second current mirrors;

a compensation impedance connected to the input of said output stage and to the outputs of said first and second current mirrors; and a distortion correction circuit for directly sensing the distortion voltage across said output stage and providing to said current mirrors a current representative of said distortion voltage for delivering to said compensation impedance a correction current to develop a correction voltage at the input of said output stage to nullify the effect of said distortion voltage.

8. The output distortion correction amplifier system of claim 7 in which said compensation impedance includes a capacitor.

9. The output distortion correction amplifier system of claim 7 in which said distortion correction circuit includes at least one buffer amplifier and a nullifying impedance.

10. The output distortion correction amplifier system of claim 9 in which said nullifying impedance includes a capacitor.

11. The output distortion correction amplifier system of claim 9 in which said nullifying impedance is proportional to the compensation impedance in the ratio of the current representative of the distortion voltage to the correction current.

12. The output distortion correction amplifier system of claim 9 in which said distortion circuit includes two buffer amplifiers with their low impedance outputs connected to said nullifying impedance.

13. The output distortion correction amplifier system of claim 12 in which said two buffer amplifiers have their inputs connected across said output stage.

14. The output distortion correction amplifier system of claim 13 in which said two buffer amplifiers each have first and second high impedance outputs, each of the first high impedance outputs coupled to the first current mirror, each of the second high impedance outputs coupled to the second current mirror.

15. The output distortion correction amplifier system of claim 1 in which said compensation impedance includes a capacitor.

* * * * *